United States Patent [19]

Heuvel

[11] Patent Number: 5,484,097
[45] Date of Patent: Jan. 16, 1996

[54] FABRICATION OF HYBRID SEMICONDUCTOR DEVICES

[75] Inventor: William Heuvel, Ft. Salonga, N.Y.

[73] Assignee: General Instrument Corp., Hatboro, Pa.

[21] Appl. No.: 273,854

[22] Filed: Jul. 12, 1994

[51] Int. Cl.⁶ .................................................. H01L 21/60
[52] U.S. Cl. .......................... 228/123.1; 29/827; 29/856
[58] Field of Search .................... 228/180.21, 180.22, 228/122.1, 123.1; 29/854–856, 827, 841; 257/736, 776; 437/208, 206, 207

[56] References Cited

U.S. PATENT DOCUMENTS

| | | | |
|---|---|---|---|
| 4,288,912 | 9/1981 | Wills et al. | 437/208 |
| 4,801,765 | 1/1989 | Moyer et al. | 29/827 |
| 5,281,556 | 1/1994 | Shimizu et al. | 437/208 X |

Primary Examiner—Kenneth J. Ramsey

[57] ABSTRACT

Two phase bridge rectifiers are fabricated starting with three lead flames and bonding a first pair of semiconductor chips on mounting pads of a first of the frames and a second pair of semiconductor chips on mounting pads of a second of the frames. The frames are then disposed one on top of the other with upper surfaces of the first pair of chips contacting under surfaces of the mounting pads of the second frame and with upper surfaces of the second pair of chips contacting under surfaces of a pair of mounting pads on the third frame. A mounting pad on the third (upper) frame includes an extension thereof extending downwardly and bonded to a terminal formed in the second (middle) frame, and a mounting pad on the first (lower) frame includes an extension thereof extending upwardly and bonded to another terminal of the second frame.

9 Claims, 3 Drawing Sheets

005,484,097

FABRICATION OF HYBRID SEMICONDUCTOR DEVICES

BACKGROUND OF THE INVENTION

This invention relates to hybrid semiconductor devices. By "hybrid" is meant two or more separate components which are electrically and mechanically interconnected to form a semiconductor device. The invention has particular utility in the fabrication of hybrid semiconductor rectifiers, particularly two phase bridge rectifiers.

One well known semiconductor bridge rectifier circuit comprises four semiconductor diodes connected as shown in FIG. 1. In use, an A.C. voltage is applied across the terminals A and B, and a D.C. current flows through a load L always in the direction from terminal C to terminal D.

An example of a known bridge rectifier device 20 is shown in FIG. 2. The device 20 comprises two stacks of diodes; one stack comprising two diode semiconductor die or chips 10 and 12 (see, also FIG. 1) and the other stack comprising two diode semiconductor chips 14 and 16. The two chips 10 and 12 are connected together by means of a terminal D which is sandwiched between the two chips and which extends laterally outwardly from the two-chip stack (e.g., perpendicular to the plane of the drawing). Similarly, the two chips 14 and 16 are connected together and sandwich therebetween an outwardly extending terminal C.

A terminal A electrically and mechanically interconnects the two diode stacks and is electrically connected to the anode of the diode chip 10 and to the cathode of the chip 14. Similarly, a terminal B electrically and mechanically interconnects the anode of the chip 12 and the cathode of the chip 16.

With the various diodes interconnected as shown in FIG. 2, the assembled device comprises a bridge rectifier which can be utilized as shown in FIG. 1.

A feature of the device shown in FIG. 2 is that the two terminals C and D extend laterally outwardly from the two diode stacks and lie in a common plane. The terminal A extends laterally beyond the top end of one of the diode stacks and then downwardly and laterally in the plane of the terminals C and D. Similarly, the terminal B extends laterally beyond the bottom end of the other diode stack and then upwardly and laterally in the common plane. An advantage of disposing all the terminals in a common plane is that it facilitates mounting of the rectifier device on a printed circuit board. For example, the rectifier (encapsulated in a plastic envelope, not illustrated) can be mounted on a printed circuit board with the in-plane terminals A, B, C and D pressed against a surface of the circuit board. The terminals are then soldered to printed circuit paths on the circuit board which extend beneath the rectifier terminals.

Heretofore, the rectifier devices shown in FIG. 2 have been assembled more or less manually, e.g., by successively disposing the various components of the device, i.e., the individual terminals A, B, C and D, and the individual diode chips 10, 12, 14 and 16, into contoured cavities in a jig, and then simultaneously soldering together the components.

The present invention is concerned with automated fabrication of hybrid devices. The invention is described in connection with the fabrication of devices of the type shown in FIG. 2, but the utility of the invention is not limited to such device fabrication.

SUMMARY OF THE INVENTION

The fabrication process utilizes lead flames, that is, elongated sheets of metal which are patterned to include identical and spaced apart groups of device components. In a preferred embodiment, three separate lead frames are used which are stacked one on top of the other with semiconductor chips sandwiched between the frames to form chip pairs of chip stacks. The lead frames include various terminals which electrically and mechanically interconnect the various chips to provide the desired device.

In accordance with one aspect of the invention, upper, lower and middle lead frames are used. In the upper and lower frames, each group of components includes two connected together chip pads and a terminal extending from one of the pads. The middle frame includes two spaced apart chip pads and first and second terminals disposed adjacent to the two chip pads but separated therefrom and from each other. In use, the three frames are disposed one on top of the other, and, when so disposed, the various groups of components on the frames are disposed in precisely aligned overlapped relationship.

In general, each lead frame comprises a thin, flat sheet of metal including various device components formed by the patterning of the sheet. As initially formed, all of the sheet components lie in the plane of the sheet, and all the components are held in place by a filigree of interconnected links or struts. Prior to use of the frames to form the devices, the terminals extending from the chip pads on the upper frame are bent to extend downwardly out of the plane of the frame, and the terminals on the lower frame are bent to extend upwardly out of the plane of the lower frame.

Then, while the frames are still separate from one another, a diode chip is bonded to each of the chip pads of the middle and lower frames, i.e., two chips for each group of components on the two frames.

The three frames are then disposed in stacked relationship. In each group of components (forming a single device), the upper surfaces of the two chips on the lower frame contact respective bottom surfaces of the two chip pads on the middle frame. Similarly, the upper surfaces of the two chips on the middle frame contact respective bottom surfaces of the two chip pads on the upper frame. This forms two stacks of diode chips, each stack comprising two chips, and each stack including upper, middle and lower terminals provided by the chip pads of the upper, middle and lower frames, respectively.

Additionally, the upwardly extending terminal on the lower frame contacts the lower surface of the first terminal on the middle frame, and the downwardly extending terminal on the upper frame contacts the upper surface of the second terminal on the middle frame.

Then, by means of previously applied layers of solder, the various contacting parts are soldered together to form rigid assemblies. In known fashion, each spaced group of soldered together components is encapsulated in a plastic package and various links or struts extending outwardly of each package are cut for separating the packages from the flames and for providing electrically separate terminals for each package. As described hereinafter, all the terminals extending outwardly from the device package comprise portions of the middle frame, hence all the terminals lie in a common plane.

DESCRIPTION OF THE DRAWING

In FIG. 8, a downwardly extending terminal from the upper frame is omitted to make the drawing less complicated and, similarly, in FIG. 9, an upwardly extending terminal from the lower frame is omitted;

DESCRIPTION OF PREFERRED EMBODIMENTS OF THE INVENTION

Figure 10:
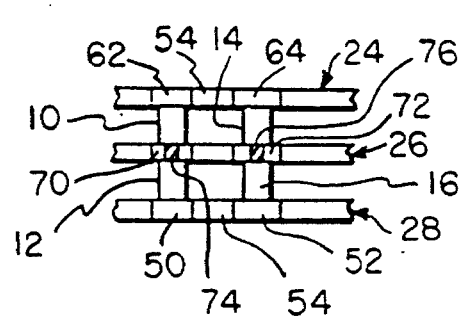

As previously mentioned, the present invention is described in connection with the automated fabrication of two phase bridge rectifiers of the type shown in FIG. 2 (see, also, FIG. 10). To this end, three lead flames 24, 26, and 28 are used, as shown in FIG. 3.

Lead flames are known in the semiconductor industry. Typically, such lead flames are used in the fabrication of integrated circuits employing semiconductor chips having, on a relatively small surface area, a relatively large number of terminal areas to which terminal wires are to be bonded. The known lead frames include a plurality of cantilevered leads extending from opposite directions towards a central open area of each frame. The semiconductor chip is disposed within the frame open area, e.g., using a jig, with the leading ends of the leads extending towards opposite sides of the chip. Depending upon the device dimensions, the lead ends can overlie the chip edges and be directly bonded to the chip terminal areas, or lead wires can be bonded between the terminal areas and the lead ends. In some instances, one of the lead ends is bent downwardly from the plane of the frame and extends under the central open area of the frame to provide a mounting pad for the chip. An example of such a known lead frame and its use in the fabrication of semiconductor devices is shown in U.S. Pat. No. 5,223,739, issued Jun. 29, 1993, the subject matter of which is incorporated herein by reference.

While the lead frames used according to the present invention differ from the prior art lead frames, as will become clear hereinafter, because known lead frame fabrication techniques and materials can be used in the lead frames herein, the term "lead frame" is herein adopted.

Each lead frame comprises a discrete, elongated sheet of metal, e.g., of copper, having a thickness of 5 mils, and each frame includes a plurality of groups of device components whereby "batch" processing techniques can be used. That is, groups of identical rectifier devices are simultaneously fabricated according to the invention.

Each of the lead frames comprises a pair of spaced apart side rails 30 and 32, with each rail including feeding and positioning openings 34 whereby the various frames can be mounted for precise in-step movements along parallel paths 36, 38, and 40 past and through various work stations. Various apparatus for precisely indexing and performing various processes on and in connection with lead frames are well known in the semiconductor industry, hence are not illustrated herein.

Extending between each pair of side rails 30 and 32 of each frame are spaced apart cross bars 42, and to and between the various cross bars 42 are connected various groups of components. By "components" is meant, for the presently illustrated embodiment of the invention, the various electrical and mechanical interconnections used in the hybrid devices being made. By "groups" is meant those components used in the fabrication of each hybrid device. All the groups of components are, in this embodiment, identical to one another, hence, where not specifically illustrated, certain component groups are identified by dashed lines. Also, to facilitate further description, each group of components includes a central, horizontal axis 44.

Because all the groups of components, after assembly into individual devices, are to be separated from one another and from the various lead frames, a filigree arrangement of spaced apart cross bars 42 and various links or struts 46 is used to facilitate device separations using known punch an die stamping processes.

The lead frames can be formed using known stamping processes or, where particularly small dimensions are required, by known photolithographic processes.

Figure 7:
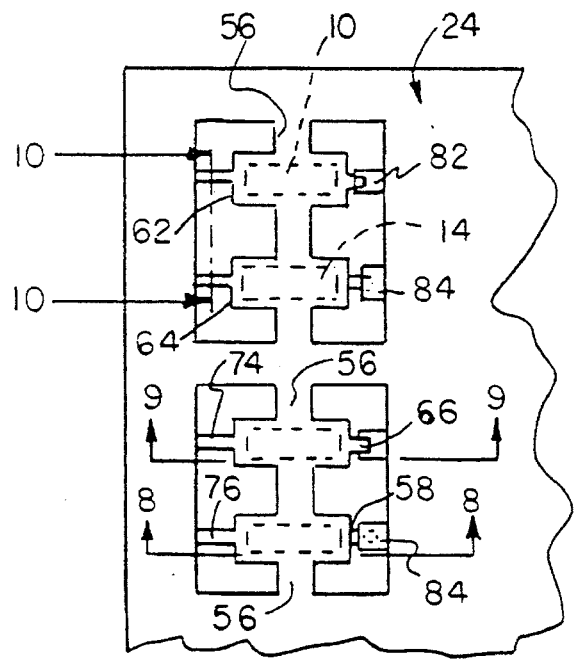
FIG. 7 is a plan view of two groups of components formed when the upper, middle and lower frames are stacked together.

In FIG. 3, the three frames 24, 26 and 28 are disposed in precise left to right alignment with one another along their respective paths 36, 38 and 40. When the three frames are disposed in overlapped relationship to each other, as hereinafter described, the horizontal center lines 44 shown for each frame group of components precisely overlie one another. Such overlapped condition is illustrated in FIG. 7.

Figure 5:
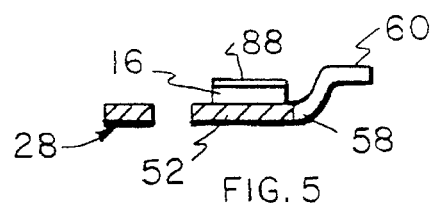

Considering the "components" of each group on each frame, the group components of the lower frame 28 (FIG. 3) comprise two chip pads 50 and 52 (see, also, FIG. 5) connected together by a link 54. (FIG. 3 also shows semiconductor chips 12 and 16 mounted an the chip pads 50 and 52, respectively.) The two pads 50 and 52 are also connected by links 56 to portions of the frame surrounding the component groups. As shown in FIG. 3, the chip pad 52 is disposed "below" the group central axis 44, and to this pad 52 is connected an extending terminal 58 having an upwardly bent free end 60 (FIG. 5). No such terminal is connected to the "upper" pad 50 of the lower frame 28.

Figure 4:
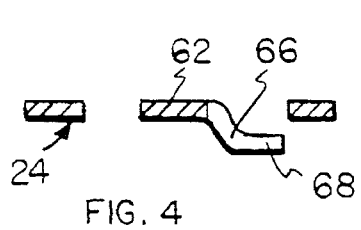
FIGS. 4 and 5 are cross-sectional views taken along the fines 4—4 (upper frame) and 5—5 (lower frame) of FIG. 3, respectively, showing a downwardly extending terminal of the upper frame and an upwardly extending terminal of the lower frame.

The component groups on the upper frame 24 are substantially identical to the groups on the lower frame 28 and comprise two connected together chip pads 62 and 64 disposed respectively above and below the group central axis 44. However, conversely to the arrangement on the lower frame 28, in the upper frame 24, a terminal 66 extends laterally from the chip pad 62 disposed "above" the horizontal axis 44 and not from the "lower" chip pad 64. As shown in FIG. 4, the terminal 66 includes a downwardly extending free end 68. (Note that semiconductor chips are not disposed on the pads 62 and 64.)

The component groups on the middle frame 26 (FIG. 3) also include two chip pads 70 and 72 which, however, are not directly connected together as are the chip pads on the upper and lower frames 24 and 28. Rather, there is a gap between the two pads 70 and 72, and each pad includes an extending terminal 74 and 76, respectively. The two terminals 74 and 76 are connected to frame cross bars 42 and serve the dual function of supporting the two pads 70 and 72 in place on the frame 26 and, after device encapsulation and frame severance (described hereinafter), as terminals for the completed device.

Figure 6:
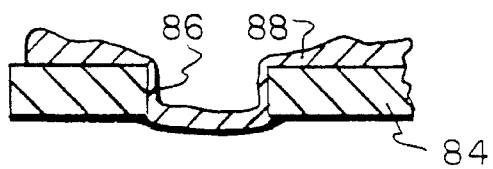
FIGS. 6 is a cross-sectional view, on an enlarged scale, taken along line 6—6 of FIG. 3 and showing a solder layer on a terminal of the middle frame.

Also included in each component group of the middle frame 26 is a pair of terminals 82 and 84 disposed one each adjacent to a respective chip pad 70 and 72. One end of each terminal 82 and 84 is secured to a frame cross bar 42, and the other, free ends of the terminals are spaced from the respective chip pads 70 and 72. The free end of the terminal 84, that is, the terminal extending towards the chip pad 72 disposed "below" the central axis 44, has an opening 86 therethrough (see, also, FIG. 6).

Figure 1:
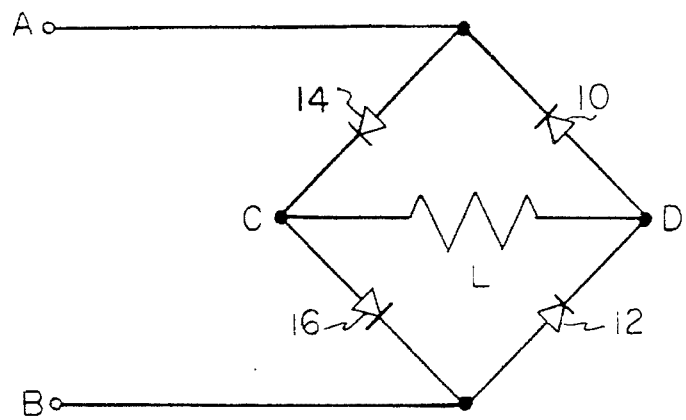
FIG. 1 is a circuit diagram showing a known two phase bridge rectifier circuit.
Figure 2:
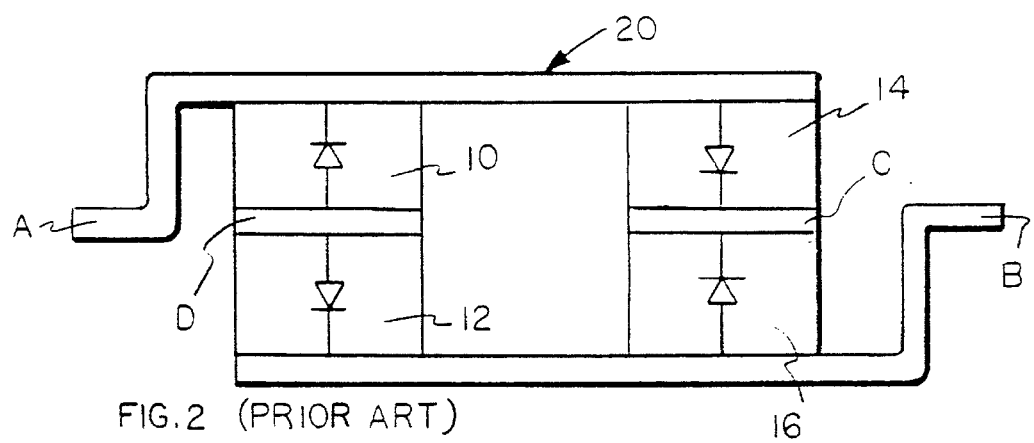
FIG. 2 is a side elevation of a known two phase bridge rectifier device (without an enclosing package) suitable for use in the FIG. 1 circuit.
Figure 3:
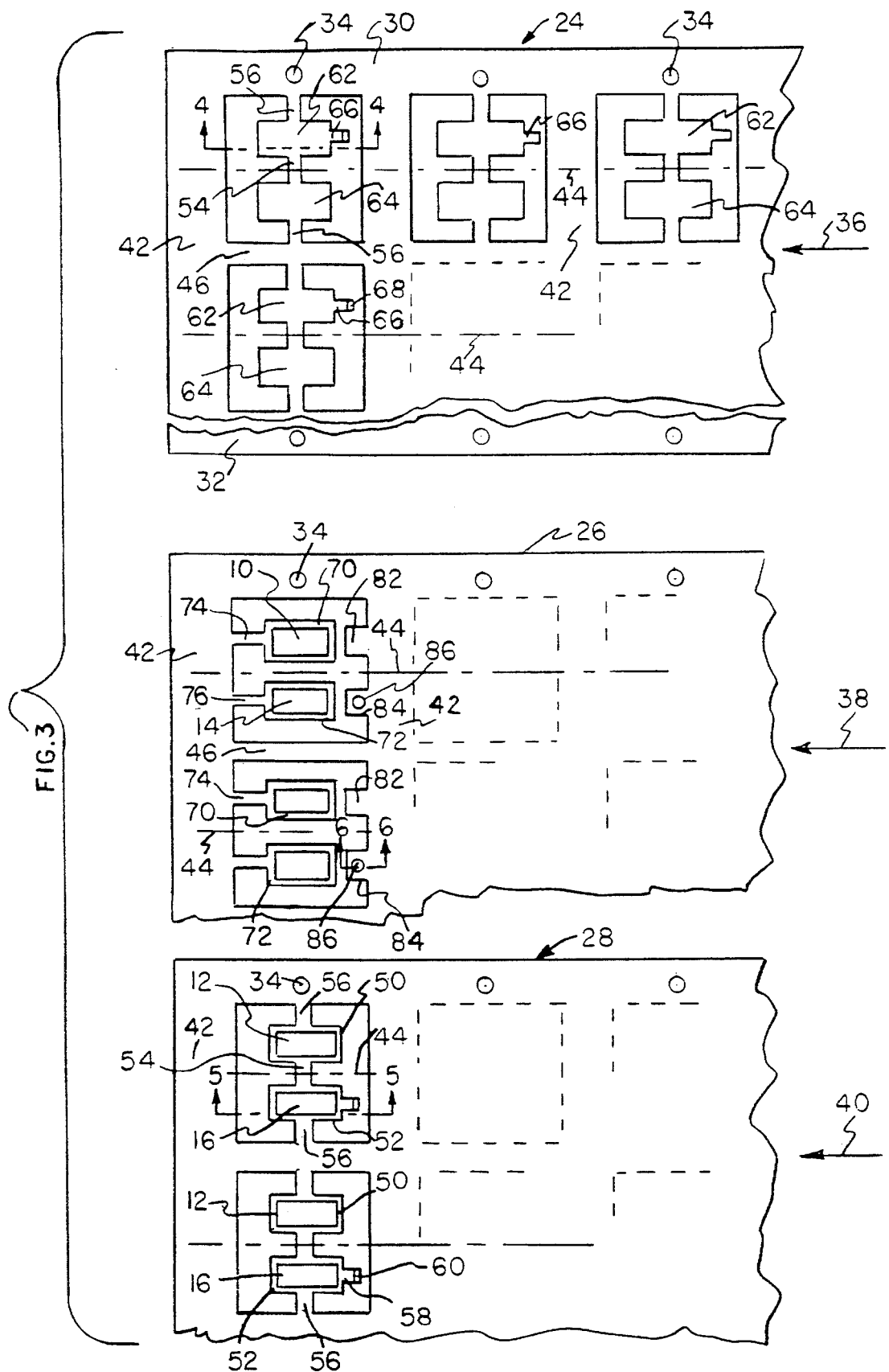
FIG. 3 is a plan view showing three separate lead frames, referred to as upper, middle and lower flames, in side by side relation.

The use of the three frames in the fabrication of two phase bridge rectifiers of the type shown in FIG. 2 is now described.

Most economically, the following processes are performed automatically, by machine, and the identical process is performed on each component group of a frame. Suitable apparatus of the type for performing the following processes are generally known, or can be readily designed using known technology, hence are not described herein. Also, the various following processes can be done manually.

In a first process (FIG. 3), two diode chips 12 and 16 (see, also, FIG. 2) are mounted on the two pads 50 and 52 of the lower frame 28, and two chips 10 and 14 are mounted on the two pads 70 and 72 of the middle frame 26. The various chips can be of known type, e.g., of rectangular shape having anode and cathode electrodes on opposite surfaces. The various chips are oriented on their respective pads to achieve the chip orientation as shown in FIG. 2. Thus, the chips 12 and 14 are mounted anode side down on the pads 50 (frame 28) and 72 (frame 26), respectively, and the chips 10 and 16 are mounted cathode side down on the pads 70 (frame 26) and 52 (frame 28), respectively.

All the thus mounted chips are then bonded to their respective pads, e.g., by soldering using solder pre-applied to the anode and cathode sides of the chips.

Then, in anticipation of a further soldering process, layers 88 of solder are applied onto the upper surfaces of the free ends of the middle frame (26) terminals 82 and 84. The openings 86 through the ends of the terminals 86 are sufficiently small, for the solder used, that, while the solder layers 88 (FIG. 6) enter into and fill the openings 86 and even flow somewhat onto the bottom surfaces of the terminals 86, the solder does not drip off the terminals 86 and remains in place thereon owing to the surface tension of the molten solder.

The three frames 24, 26 and 28 are then stacked one on top of the other in precise alignment of the various component groups of the three frames as shown in FIGS. 7–10.

In such stacked relationship, the two chip pads 50 and 52 (FIG. 10) on the lower frame directly underlie the two chip pads 70 and 72 on the middle frame 26 with the upper soldered surfaces of the two chips 12 and 16 mounted on the lower frame 28 contacting the bottom surfaces of the middle frame chip pads 70 and 72, respectively.

Similarly, the upper, soldered surfaces of the two chips 10 and 14 mounted on the middle frame 26 directly underlie and contact the bottom surfaces of the chip pads 62 and 64, respectively, on the upper frame 24.

Figure 8:
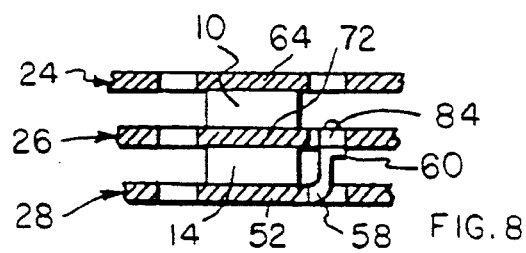
FIGS. 8, 9 and 10 are cross-sectional views taken along lines 8—8, 9—9 and 10—10, respectively, of FIG. 7.
Figure 9:
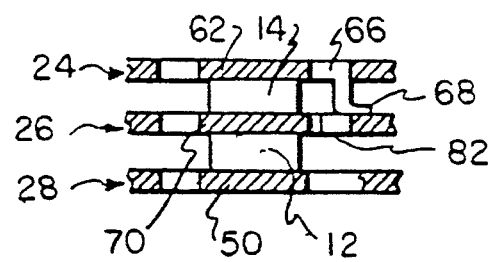

Also, the upwardly extending terminal 58 connected to the chip pad 52 of the lower frame 28 directly underlies and contacts (FIG. 8) the bottom surface of the terminal 84 on the middle frame 26, and (FIG. 9) the downwardly extending terminal 66 connected to the chip pad 62 of the upper frame 24 directly overlies and contacts the upper surface of the terminal 82 on the middle frame 26. Obviously, the upwardly and downwardly extending lengths of the two terminals 58 and 66 are selected to bridge the gaps between the stacked frames, such gaps being a function of the thickness of the various chips including the layers of solder thereon. (Note, to simplify the drawing figures, the downwardly extending terminal 66 shown in FIG. 9 is omitted from FIG. 8 and, similarly, the upwardly extending terminal 58 shown in FIG. 8 is omitted from FIG. 9.)

An advantage of providing the opening 86 (FIGS. 3 and 6) through the terminals 84 on the waddle frame 26 is that solder can be applied simultaneously only to the upper surfaces of the terminals 82 and 84 on the middle frame while still obtaining bonded joints between the upwardly extending terminals 58 (FIG. 8) from the lower frame 28 and the under surfaces of the terminals 84. Such soldering is obtained by virtue of the passage of the solder layer 88 (FIG. 6) to the under surfaces of the terminals 84. This avoids the need for a separate step of applying solder to the terminal 84 under surface. FIG. 3 shows circular shaped openings 86. Other opening shapes are possible; e.g., a C-shaped opening formed by an edge of the openings 86 overlapping a side edge of the terminals 84.

After soldering, the basic two phase bridge rectifiers have been completed. Thus, with reference to FIG. 10, two stacks of diodes are present; one comprising the chips 10 and 12 bonded together by the intermediate chip pad 70, and the other comprising the chips 14 and 16 bonded together by the intermediate chip pad 76. Additionally, the upper ends of the two stacks are bonded together by the pad connecting link 54 (see, also, FIG. 3) on the upper frame 24, while the lower ends of the two stacks are bonded together by the pad connecting link 54 on the lower frame 28.

Terminals for the rectifier comprise (although still connected together via the various frames) the middle frame terminals 74 and 76 (FIG. 3) which correspond to terminals D and C in FIG. 2, and the middle frame terminals 82 and 84 (connected, respectively, to the upper frame terminal 66 and the lower frame terminal 58) which correspond to the rectifier device terminals A and B.

Although the basic bridge rectifiers have been completed, the various rectifier devices have to be individually packaged and separated from one another.

Figure 11:
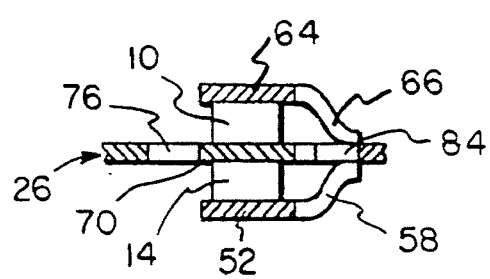
FIG. 11 is a view generally similar to FIG. 8 but showing a stacked together group of components after removal of the upper and lower frames except for portions thereof soldered within the component group.

The separation process begins with cutting through the links 56 (FIGS. 3 and 7) connecting the chip pads 62 and 64 to the upper frame 24 and connecting the chip pads 50 and 52 to the lower frame 28. Known high speed, parallel cutting wheels can be used. With the links 56 cut, the chip pad surrounding portions of the upper and lower frames are no longer secured to the middle frame or to the stacked together chip assemblies, hence these surrounding portions of the upper and lower frames are stripped away. A cross section taken through one of the stacked chip assemblies is shown in FIG. 11. FIG. 11 is similar to FIG. 8 except that portions of the upper frame 24 and the lower frame 28 are missing. Also, unlike FIG. 8, FIG. 11 shows the terminal 66 extending downwardly from the chip pad 64 as well as the upwardly extending terminal 58 shown in FIG. 8. Note that a plan view of the workpiece remaining after removal of the portions of the upper frame 24 and the lower frame 28 is quite similar to FIG. 7 except that the links 56 shown in FIG. 7 are missing and the only frame present is the middle frame 26.

Figure 12:
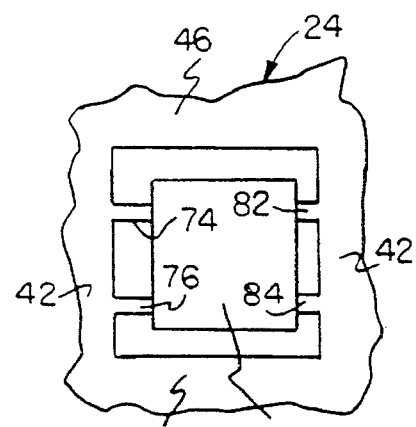
FIG. 12 is a view similar to FIG. 7 but showing a single group of components resin encapsulated to form a single rectifier device.

The remaining assembled together rectifier devices, still attached to the middle frame, are disposed in a mold and a known packaging resin is forced into the mold under pressure. The resin flows around and completely encapsulates the pairs of rectifier stacks and their interconnecting terminals and, upon hardening of the resin and the opening of the molds, has the appearance as shown in FIG. 12, which shows one encapsulated group of device components. Each rectifier device comprises a solid resin envelope 90 having various terminals 74, 76, 82 and 84 extending therefrom and still integrally connected to the middle frame 26. The two terminals 66 and 58 (FIG. 11) connecting the chip pads 62 and 50 (from the upper and lower frames 24 and 28, respectively) to the middle frame 26 are completely enclosed within the package 90.

Figure 13:
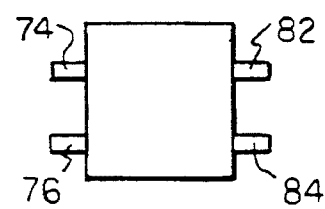
FIG. 13 is a view similar to FIG. 11 but showing a single device separate from the lead frame assembly.

To complete the process, the various terminals 74, 76, 82 and 84 are cut to separate the individual devices from the middle frame 26. A resulting device is shown in FIG. 13. Significantly all four terminals 74, 76, 82 and 84 lie in a common plane (of the middle frame 26), thus facilitating automatic mounting of the rectifier devices on printed circuit boards as previously described.

A feature of the invention is that stacks of semiconductor chips having various electrodes disposed at different levels of the stacks can be batch fabricated using known lead frame technology. While the invention has been disclosed in connection with two pairs of two-chip stacks, various modifications using different numbers of stacks and stacks containing additional chips or device components are readily feasible.

What is claimed is:

1. A method of fabricating a semiconductor device comprising mounting a first pair of semiconductor chips on respective ones of first and second integrally connected mounting pads lying in a common plane, one of said pads having a first terminal extending upwardly therefrom, mounting a second pair of semiconductor chips on respective ones of spaced apart third and fourth mounting pads, said third and fourth pads lying in a common plane and forming part of a lead frame, said lead frame including a second terminal extending towards and spaced from one of said third and fourth pads, disposing said third and fourth pads over said first pair of chips with upper surfaces of said first pair of chips contacting under surfaces of respective ones of said third and fourth pads and with a surface of said first terminal contacting a surface of said second terminal, and bonding said contacting surfaces together to form a rigid assembly.

2. A method according to claim 1 including, prior to said bonding of said contacting surfaces, the steps of providing of fifth and sixth integrally connected mounting pads lying in a common plane, and disposing said fifth and sixth pads over said second pair of chips with upper surfaces of said second pair of chips contacting under surfaces of respective ones of said fifth and sixth pads.

3. A method according to claim 2 wherein said lead frame includes a third terminal extending towards and spaced from a second of said third and fourth pads, and one of said fifth and sixth pads has a fourth terminal extending downwardly therefrom, and, during said step of disposing said fifth and sixth pads, contacting a surface of said fourth terminal with a surface of said third terminal.

4. A method according to claim 3 including the steps of providing upper, middle and lower lead frames each including spaced apart groups of components, said components in each group of said lower frame comprising said first and second mounting pads and said first terminal, said components in each group of said middle frame comprising said third and fourth mounting pads and said second and third terminals, and said components in each group of said upper frame comprising said fifth and sixth mounting pads and said fourth terminal.

5. A method according to claim 3 wherein said lead frame second terminal has upper and lower oppositely disposed surfaces and an opening extending between said upper and lower surfaces, the method including the steps of, prior to said disposing step, providing a layer of solder on said upper surface of said second terminal adjacent to said opening therethrough, and, in said disposing step, contacting said first terminal with said lower surface of said second terminal, and, in said bonding step, heating said solder to cause it to contact said first terminal through said opening for bonding said first terminal to said second terminal.

6. A method according to claim 5 including, prior to said disposing step, providing a layer of solder on said upper surfaces of said second pair of chips and on the upper surface of said third terminal.

7. An assembly for use in the fabrication of semiconductor devices comprising upper, middle and lower frames in bonded together, overlapped relationship, said frames including a plurality of spaced apart groups of device components, each of said groups including:

(a) first and second pads integrally connected to one another and to said lower frame, said first and second pads and said lower frame lying in a first plane and said first pad having an integral extension thereof forming a first terminal extending upwardly from said first plane and bonded to an under surface of a second terminal integral with said middle frame and lying in a second plane including said middle frame, (b) first and second semiconductor chips bonded to upper surfaces of respective ones of said first and second pads and extending upwardly therefrom and being bonded to respective ones of under surfaces of third and fourth spaced apart pads integral with and lying in said second plane, (c) third and fourth semiconductor chips mounted on respective ones of said third and fourth pads and extending upwardly therefrom and being bonded to respective ones of under surfaces of fifth and sixth pads integrally connected to one another and lying in a third plane including said upper frame, said fifth pad having an integral extension thereof forming a third terminal extending downwardly from said third plane and bonded to an upper surface of a fourth terminal integral with said middle frame and lying in said second plane.

8. An assembly according to claim 7 wherein said middle frame second and fourth terminals comprise elongated, cantilevered leads extending towards respective ones of said third and fourth pads but spaced therefrom, and said third and fourth pads having respective integral extensions thereof lying in said second plane and forming fifth and sixth terminals.

9. A method of fabricating semiconductor devices comprising bonding a first pair of semiconductor chips on mounting pads of a lower lead frame, bonding a second pair of semiconductor chips on mounting pads of a middle frame, disposing said middle frame on said lower frame with upper surfaces of said first pair of chips engaging respective ones of under surfaces of said mounting pads of said middle frame and with a first terminal extending upwardly from one of said pads on said lower frame to a second terminal on said middle frame, and disposing an upper frame on said middle frame with upper surfaces of said second pair of chips engaging respective ones of under surfaces of mounting pads of said upper frame with a third terminal extending downwardly from one of said pads on said upper frame to a fourth terminal on said middle frame.

* * * * *

UNITED STATES PATENT AND TRADEMARK OFFICE
CERTIFICATE OF CORRECTION

PATENT NO. : 5,484,097
DATED      : Jan. 16, 1996
INVENTOR(S) : William Van denHeuvel It is certified that error appears in the above-indentified patent and that said Letters Patent is hereby corrected as shown below:

On the title page item [75], should read:

-- William Van denHeuvel --

Signed and Sealed this

Twenty-fifth Day of June, 1996

Attest:

BRUCE LEHMAN

Attesting Officer

Commissioner of Patents and Trademarks